United States Patent
Zhu et al.

(10) Patent No.: US 9,362,128 B2
(45) Date of Patent: Jun. 7, 2016

(54) METHODS FOR FABRICATING INTEGRATED CIRCUITS AND COMPONENTS THEREOF

(71) Applicant: GLOBALFOUNDRIES Singapore Pte. Ltd., Singapore (SG)

(72) Inventors: Ming Zhu, Singapore (SG); Yiang Aun Nga, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/258,154

(22) Filed: Apr. 22, 2014

(65) Prior Publication Data

US 2015/0303117 A1    Oct. 22, 2015

(51) Int. Cl.
| | |
|---|---|
| H01L 29/66 | (2006.01) |
| H01L 21/285 | (2006.01) |
| H01L 27/06 | (2006.01) |
| H01L 49/02 | (2006.01) |
| H01L 21/266 | (2006.01) |
| H01L 21/8234 | (2006.01) |

(52) U.S. Cl.
CPC ........ *H01L 21/28518* (2013.01); *H01L 21/266* (2013.01); *H01L 21/823425* (2013.01); *H01L 27/0629* (2013.01); *H01L 28/20* (2013.01); *H01L 29/665* (2013.01); *H01L 29/6656* (2013.01)

(58) Field of Classification Search
CPC combination set(s) only.
See application file for complete search history.

(56) References Cited

U.S. PATENT DOCUMENTS

| | | | |
|---|---|---|---|
| 8,288,800 B2 | 10/2012 | Zhu et al. | |
| 2007/0057331 A1* | 3/2007 | Satou | H01L 21/28097 257/384 |
| 2007/0187776 A1* | 8/2007 | Sasaki | H01L 28/20 257/379 |
| 2008/0173955 A1* | 7/2008 | Kawasumi | H01L 27/1104 257/401 |
| 2010/0219485 A1 | 9/2010 | Chong et al. | |
| 2012/0280323 A1* | 11/2012 | Chuang | H01L 27/0266 257/368 |
| 2013/0005097 A1* | 1/2013 | Xu | H01L 29/66545 438/229 |
| 2013/0052819 A1 | 2/2013 | Scheiper et al. | |
| 2013/0087463 A1 | 4/2013 | Schroiff et al. | |
| 2013/0093023 A1* | 4/2013 | Yamada | H01L 27/0623 257/378 |
| 2013/0295739 A1 | 11/2013 | Hsiao et al. | |
| 2014/0027859 A1* | 1/2014 | Gerhardt | H01L 21/28202 257/392 |
| 2014/0035010 A1 | 2/2014 | Cai et al. | |
| 2014/0048874 A1 | 2/2014 | Zhang et al. | |

OTHER PUBLICATIONS

U.S. Appl. No. 14/141,530 "Integrated Circuits Including a Resistance Element and Gate-Last Techniques for Forming the Integrated Circuits", filed Dec. 27, 2013, 25 pages.

* cited by examiner

*Primary Examiner* — Dao H Nguyen
*Assistant Examiner* — Tram H Nguyen
(74) *Attorney, Agent, or Firm* — Ingrassia Fisher & Lorenz, P.C.

(57) ABSTRACT

Methods for fabricating integrated circuits and components thereof are provided. In accordance with an exemplary embodiment, a method for a fabricating a semiconductor device is provided. The method includes providing a partially fabricated semiconductor device and forming silicide regions outside of the first and second gates. The partially fabricated semiconductor device includes a semiconductor substrate, a first gate formed over the semiconductor substrate, and a second gate formed over the semiconductor substrate and spaced apart from the first gate. Silicide formation between the first gate and the second gate is inhibited.

20 Claims, 7 Drawing Sheets

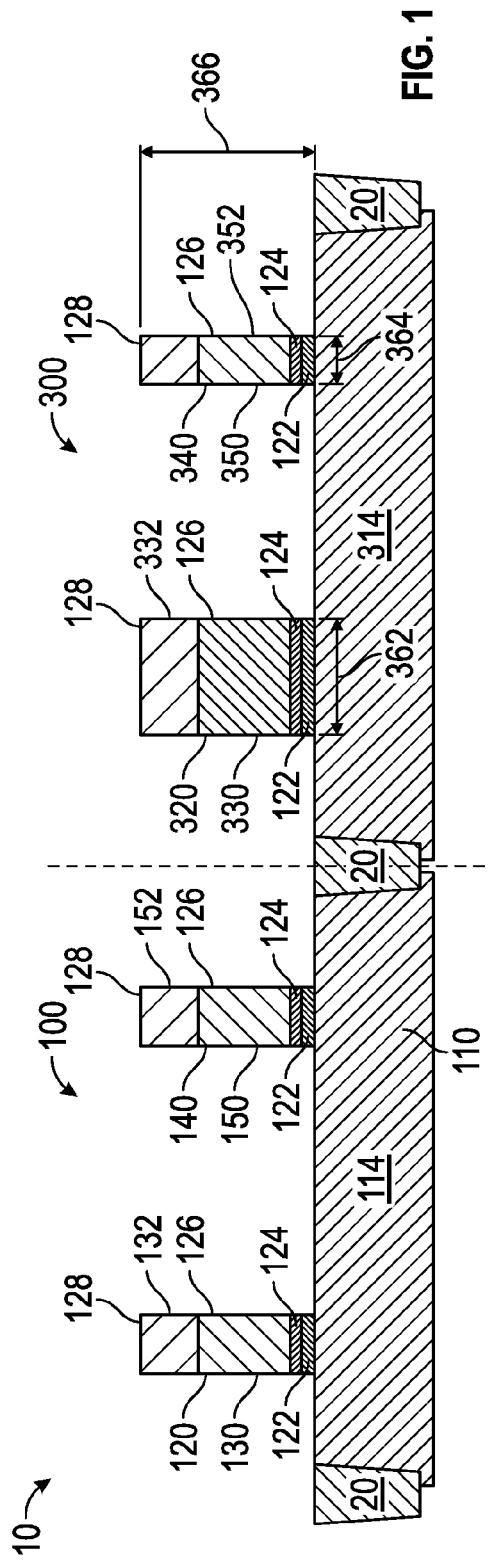
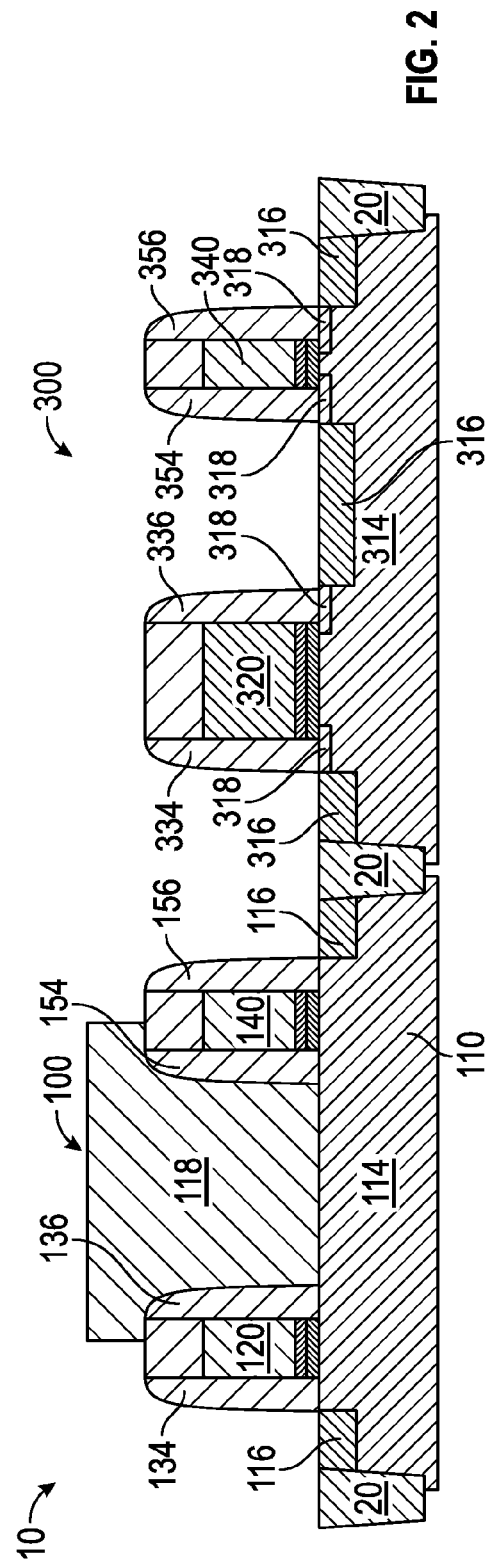

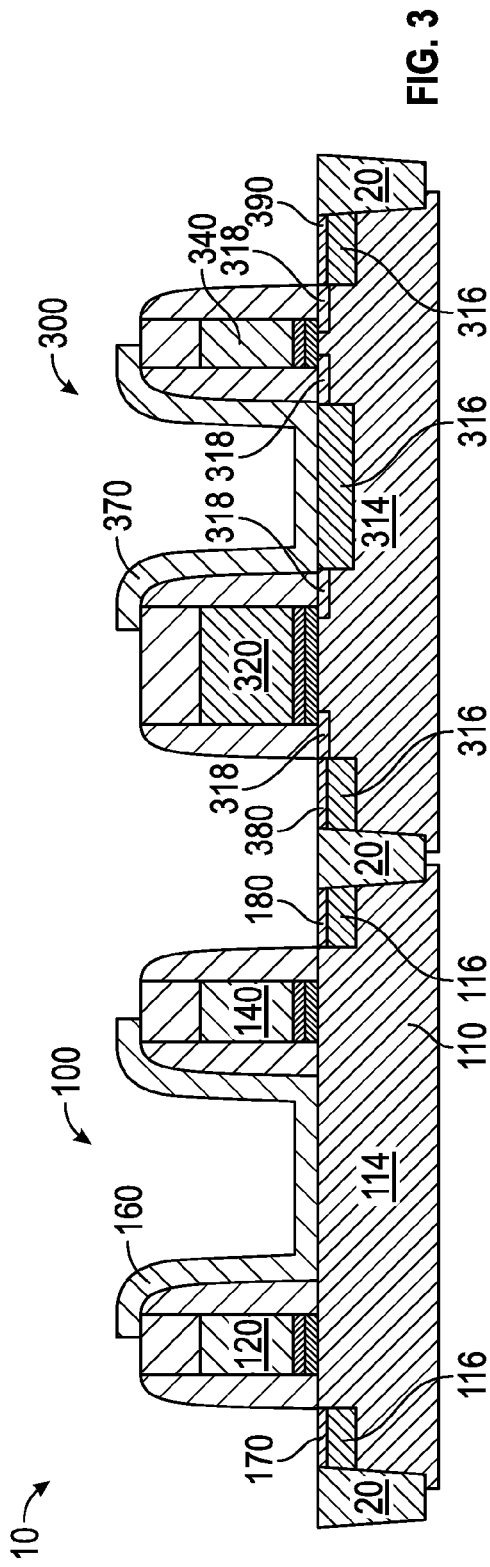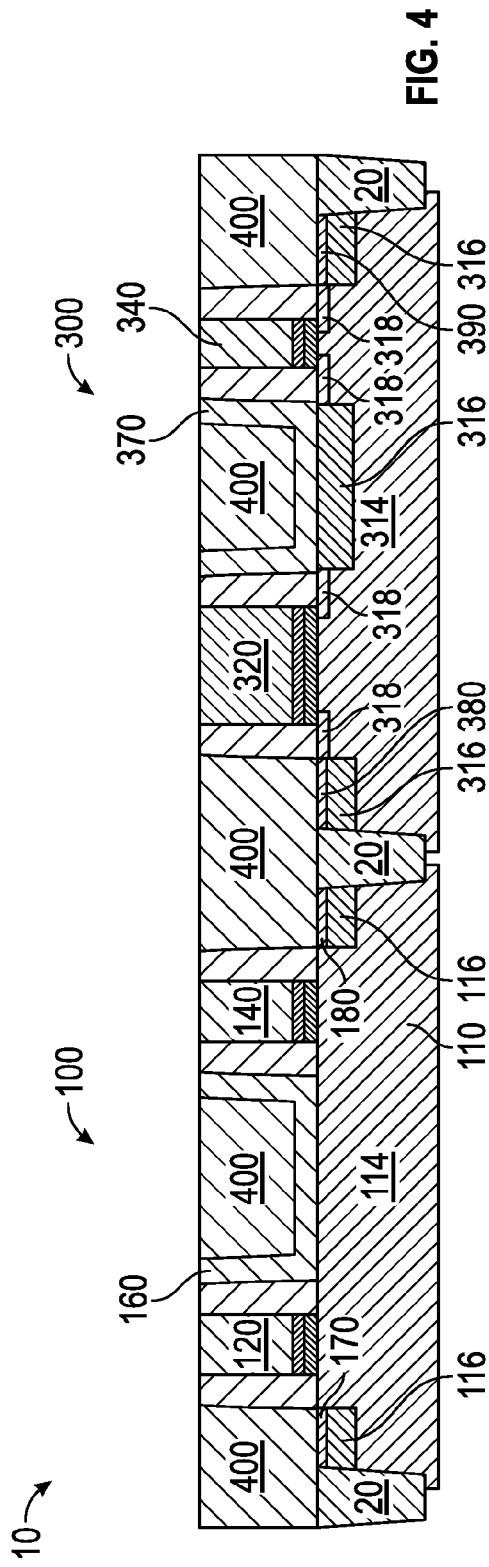

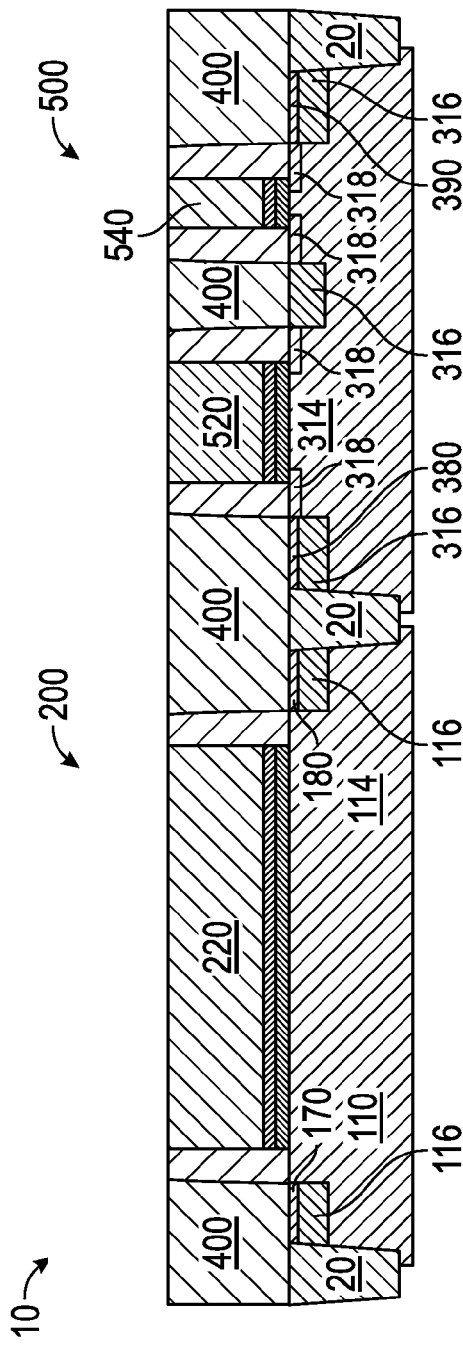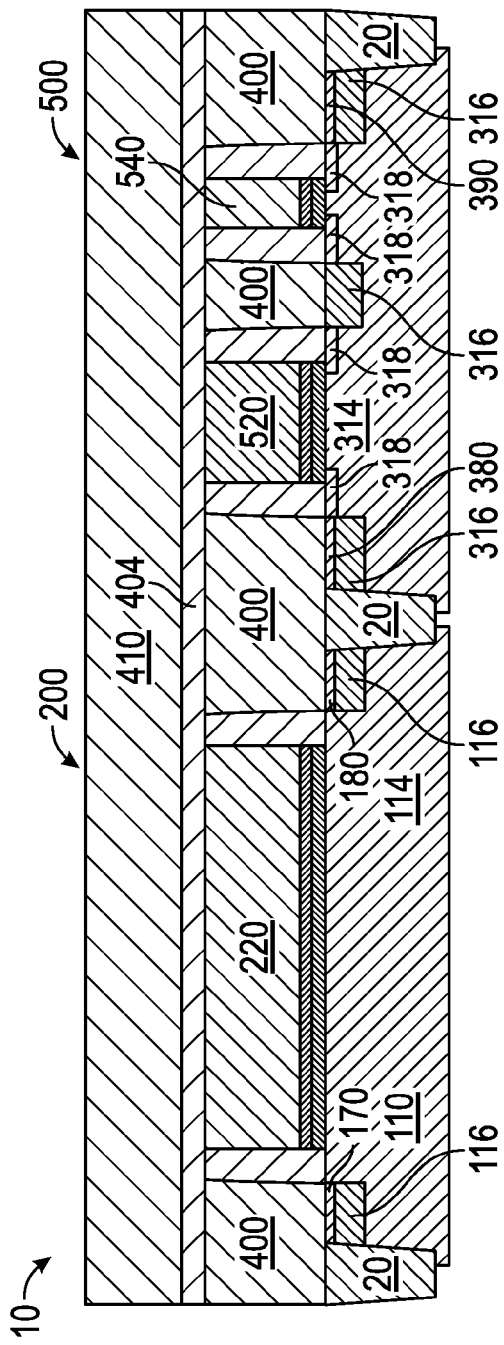

METHODS FOR FABRICATING INTEGRATED CIRCUITS AND COMPONENTS THEREOF

TECHNICAL FIELD

The present invention generally relates to methods for fabricating integrated circuits and components thereof, and more particularly relates to integrated circuits, resistors, and transistors having formed silicide regions outside at least one gate.

BACKGROUND

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions.

ICs can include both resistors and transistors. In a field effect transistor, metal silicide regions are typically formed in the source/drain regions of a transistor to reduce the resistance when a conductive contact is formed to establish electrical connection to the source/drain regions. A resist protection oxide can be used to block silicide formation of an electrostatic discharge transistor. In a resistor, the electrical resistance of the resistor can be controlled, or maintained within a desirable range by forming a metal silicide region.

However, the metal silicide layer in both resistors and transistors can impart large variations in electrical performance as compared to other devices. These variations can be caused by physical deviations in the formation of the metal silicide layer or chemical properties of the ICs. There can be several sources of this variation, including the critical dimension and/or overlay of the implantation layer and the resist protection oxide layer, the resist protection oxide etch, and the lower doping concentration of the resistor body or electrostatic discharge transistor. Although there is no silicide formation at the resist protection oxide covered region, doping limits the resistivity of the high resistive path, resulting in an area penalty. Hence, reducing variation in metal silicide formation can reduce variation in IC performance.

Accordingly, it is desirable to provide a method for fabricating integrated circuits or components that have reduced variation in metal silicide formation. In addition, it is desirable to form the metal silicide outside of at least one gate. Furthermore, other desirable features and characteristics of the present invention will become apparent from the subsequent detailed description of the invention and the appended claims, taken in conjunction with the accompanying drawings and this background of the invention.

BRIEF SUMMARY

Methods for fabricating integrated circuits and components thereof are provided. In accordance with an exemplary embodiment, a method for a fabricating a semiconductor device is provided. The method includes providing a partially fabricated semiconductor device and forming silicide regions outside of the first and second gates. The partially fabricated semiconductor device includes a semiconductor substrate, a first gate formed over the semiconductor substrate, and a second gate formed over the semiconductor substrate and spaced apart from the first gate. Silicide formation between the first gate and the second gate is inhibited.

In accordance with another exemplary embodiment, a method is provided for fabricating a resistor. The method includes providing a partially fabricated semiconductor device, implanting a dopant to form highly doped source-drain regions proximate to the first and second spacers, forming silicide regions proximate to the first and second spacers and in the source-drain regions, and depositing an interlayer dielectric material over the semiconductor substrate to form an interlayer dielectric layer. The partially fabricated semiconductor device includes a semiconductor substrate, a gate centered about the semiconductor substrate and formed thereon, and first and second spacers formed on sidewalls of the gate. The gate includes a gate dielectric layer and a polysilicon resistor layer. A capping layer and a hard mask layer are disposed over the gate, which inhibits silicide formation except to an area outside the gate.

In accordance with a further exemplary embodiment, a method is provided for fabricating an integrated circuit. The method includes providing a partially fabricated semiconductor device and forming silicide regions outside of the first and second gates. The partially fabricated semiconductor device includes a semiconductor substrate with a first well region adjacent to a second well region, and a first gate and a second gate over the first well region. Silicide formation between the first gate and the second gate is inhibited.

BRIEF DESCRIPTION OF THE DRAWINGS

The various embodiments will hereinafter be described in conjunction with the following drawing figures, wherein like numerals denote like elements, and wherein:

FIGS. 1-7 illustrate, in cross section, a technique for forming an integrated circuit including a resistor and a transistor in accordance with an exemplary embodiment; and FIGS. 8-14 illustrate, in cross section, a technique for forming an integrated circuit including a resistor and a transistor in accordance with another exemplary embodiment.

DETAILED DESCRIPTION

Figure 5:
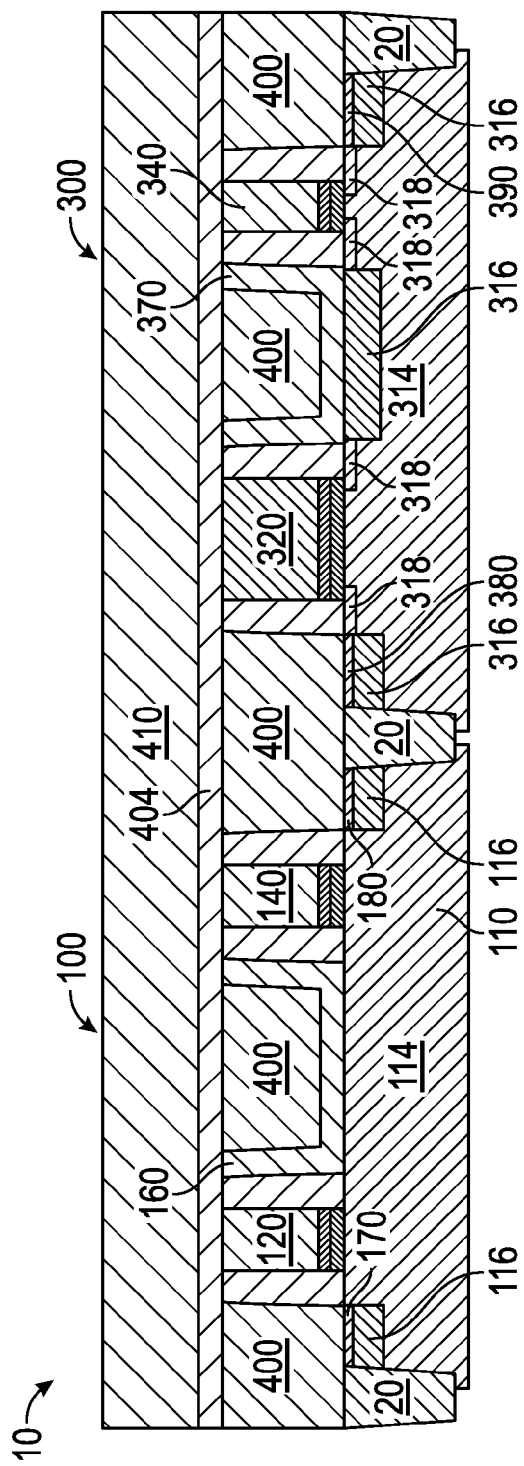

The following detailed description is merely exemplary in nature and is not intended to limit the invention or the application and uses of the invention. Furthermore, there is no intention to be bound by any theory presented in the preceding background or the following detailed description.

Integrated circuits or semiconductor devices that include a transistor and/or a resistor and, in some embodiments, gate-last techniques for forming the integrated circuits are provided herein. Particularly, some embodiments disclosed herein provide a method of providing a semiconductor substrate with a first gate and a second gate overlying the semiconductor substrate, and forming silicide regions outside of the first and second gates and inhibiting silicide formation therebetween. Inhibiting formation between the gates reduces variation in silicide formation by using the gates and dopant implantation, which is self-aligned, to control formation of the silicide regions. The method can be applied to both resistors and transistors, and can be used to manufacture a resistor adjacent to a transistor. In other embodiments a resistor is fabricated with a single gate centered about the semiconductor substrate with first and second spacers surrounding the gate. The silicide regions are formed proximate to the first and second spacers, and the resistor can be formed adjacent to a transistor of an IC.

As used herein, the term "semiconductor substrate" will be used to encompass semiconductor materials conventionally used in the semiconductor industry from which to make electrical devices. Semiconductor materials include monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or may be a thin layer of silicon on insulating layer (commonly known as silicon-on-insulator or SOI) that, in turn, is supported by a carrier wafer. As used herein, the term "overlying" means "over" and "on," wherein "on" means in direct physical contact and "over" means such that another layer may be interposed therebetween.

Referring to FIG. 1, an integrated circuit (IC) or partially formed semiconductor device 10 is provided having a resistor 100 and a transistor 300, which are separated as indicated by the dashed line. It should be understood that a partially formed semiconductor device 10 can include a resistor, a transistor, or both. As such, the resistor 100 and the transistor 300 share a semiconductor substrate 110. Shallow trench isolation (STI) structures 20 are disposed therein, including an STI structure between the resistor 100 and the transistor 300. In the illustration of FIG. 1, three STI structures 20 are formed, although it is to be appreciated that numerous STI structures 20 may be formed in the integrated circuit 10, and various networks of STI structures 20 may be formed in accordance with conventional integrated circuit design.

In accordance with an embodiment, the resistor 100 has the semiconductor substrate 110, which may include a first or N-type well region 114 that is formed through conventional fabrication techniques. The N-type well region 114 has a dopant concentration, or a concentration of conductivity-determining ions, and the conductivity-determining ions are N-type conductivity-determining ions, for forming an N-type resistor. Typical N-type conductivity-determining ions include, but are not limited to, phosphorus, arsenic, antimony, and combinations thereof. The resistor 100 includes a first gate 120 including sidewalls 130 and 132 and a second gate 140 including sidewalls 150 and 152. In one exemplary embodiment, the resistor 100 requires an N-type well region 114, as opposed to a P-type well, and excludes lightly doped regions.

The transistor 300 includes a first (or third gate on the IC 10) gate 320 including sidewalls 330 and 332 and a second (or fourth gate on the IC 10) gate 340 including sidewalls 350 and 352. In this embodiment, each gate 320 and 340 is a dummy gate electrode structure patterned overlying semiconductor material of the semiconductor substrate 110 including a second or P-type well region 314. Typical P-type conductivity-determining ions include, but are not limited to, boron, aluminum, gallium, indium, and combinations thereof. The second gate 340 has a length 364 less than a length 362 of the first gate 320, and the length 364 of the second gate 340 is no more than about 30 nanometers (nm), or no more than about 20 nm. The term "dummy", as referred to herein, means a structure or layer in which at least a portion is removed and replaced with other material during integrated circuit fabrication. In some embodiments and as shown in FIG. 1, numerous dummy gate electrode structures 320 are patterned for later formation of gate electrodes through conventional gate-last formation techniques.

Referring again to FIG. 1, the first gate 120 and the second gate 140, usually the gates are resistor structures, are patterned overlying semiconductor material of the semiconductor substrate 110. In particular, patterning of the first and second gates 120 and 140 may be conducted by first patterning a hard mask layer 128, followed by transferring the pattern in the hard mask layer 128 into underlying layers using appropriate etchants that are selective to the particular materials of various layers 122, 124, and 126 in the first and second gates 320 and 340 of the transistor 300 and the resistor structures 120 and 140. The dummy gate mask may include conventional hard mask materials, such as at least one of titanium nitride, titanium carbide, or silicon nitride, particularly such as titanium nitride. Similarly, the gates 320 and 340 of the transistor 300 also include the hard mask layer 128 overlying the layers 122, 124, and 126.

An undoped polysilicon, polysilicon resistor layer, or dummy layer 126 that overlies a metal capping layer or capping layer 124 and a gate dielectric layer or a gate dielectric layer 122 that underlies the metal capping layer 124, and the respective layers 122, 124, and 126 may be formed through conventional blanket-deposition techniques overlying the semiconductor substrate 110 followed by patterning as described above. The dummy layer 126 may be any sacrificial material including, but not limited to a deposited silicon oxide, silicon nitride, silicon oxynitride, polycrystalline silicon, amorphous silicon, amorphous carbon (a-C), and a carbon-doped silica (SiCOH). It is to be appreciated that a particular type of material for the dummy layer 126 depends upon materials chosen for other structures that are present during selective removal of the dummy layer 126. In an embodiment, the dummy layer 126 includes undoped polycrystalline silicon. The metal capping layer 124 may include any conventional capping material employed in metal gates as a capping material over the gate dielectric layer 122. Suitable materials for the metal capping layer 124 include middle gap materials, which do not materially impact final work function of the gate electrode. Examples of suitable middle gap materials include, but are not limited to, at least one of titanium nitride, titanium carbide, or silicon nitride. In one exemplary embodiment, titanium nitride is used. The gate dielectric layer 122 may include a high dielectric constant material (high-k material). As referred to herein, high-k material is a material that has a dielectric constant that is greater than silicon (dielectric constant of 3.9). Examples of suitable high-k dielectric materials include, but are not limited to, hafnium oxide, lanthanum oxide, zirconium oxide, tungsten oxide, iridium oxide, and aluminum oxide.

Referring to FIG. 2, spacers 134 and 136 are formed at respective sidewalls 130 and 132 around the gate 120, spacers 154 and 156 are formed at respective sidewalls 150 and 152 around the gate 140, spacers 334 and 336 are formed at respective sidewalls 330 and 332 around the gate 320, and spacers 354 and 356 are formed at respective sidewalls 350 and 352 around the gate 340. The spacers can be created by conformally depositing a dielectric material over the semiconductor substrate 110, where the dielectric material is an appropriate insulator, such as silicon nitride. The dielectric spacer material can be deposited in a known manner by, for example, atomic layer deposition (ALD), chemical vapor deposition (CVD), low pressure chemical vapor deposition (LPCVD), semi-atmospheric chemical vapor deposition (SACVD), or plasma enhanced chemical vapor deposition (PECVD). The layer of dielectric spacer material is deposited to a thickness so that, after anisotropic etching, the spacers formed from the layer have a thickness that is appropriate for any subsequent process steps.

The spacers 134, 136, 154, 156, 334, 336, 354, and 356 define source and drain regions and protect the gates 120, 140, 320, and 340 during subsequent high concentration dopant implantation forming highly doped source-drain regions 116 in the resistor 100 and highly doped source-drain regions 316 in the transistor 300. Prior to dopant implantation, a polysilicon mask 118 can be formed between the gates 120 and 140 of the resistor 100. In addition, lightly doped source-drain regions 318 are formed proximate to and underneath the spacers 334 and 336 of the gate 320 and spacers 354 and 356 of the gate 340 of the transistor 300. Dopants used in highly doped or lightly doped regions 116, 316, and 318 include N-type dopants, such as phosphorus or arsenic. The high concentration implant has a smaller angular spread than the lightly doped source and drain regions, but employs higher implant energies to drive dopants further into the semiconductor substrate 110.

Referring to FIG. 3, a resist protection oxide layer 160 is formed between the gates 120 and 140 and a resist protection oxide layer 370 is formed between the gates 320 and 340 to inhibit silicide formation between the gates 120 and 140, and the gates 320 and 340, as hereinafter described. The resist protection oxide layers 160 and 370 include, independently, at least one of silicon dioxide, silicon nitride, silicon oxynitride, an oxygen-doped silicon nitride, or a nitrided oxide. The resist protection oxide layers 160 and 370 can be deposited as a layer overlying the resistor 100 and the transistor 300 and patterned to expose regions for subsequent doping and/or silicidation processes. The patterning of the resist protection oxide layer includes at least one of a wet etching, a dry etching, a plasma etching, or a combination thereof. A silicidation process is to be performed on the exposed silicide regions in order to reduce contact resistance. For example, such a silicidation process is performed by depositing a metal layer over the substrate, performing an annealing process to cause metal atoms in the metal layer to react with silicon atoms in the exposed silicide regions to form a metal silicide, and then removing non-reacted portions of the metal layer. The metal deposited is at least one metal of nickel, cobalt, titanium, tungsten, molybdenum, tantalum, platinum, palladium, or copper. In an exemplary embodiment, the metal is nickel.

As such, silicide regions, namely, a first resistor silicide region 170 and a second resistor silicide region 180 are formed in the highly doped regions 116 outside the gates 120 and 140 of the resistor 100 and silicide regions, namely, the first transistor silicide region 380 and second transistor silicide region 390 in the highly doped regions 316 outside the gates 320 and 340 of the transistor 300. In the resistor 100, silicide formation is inhibited by the resist protection oxide layer 160 and the gates 120 and 140. The overlapping of the resist protection oxide layer 160 with the gates 120 and 140 eliminates dimensional variation of the silicide regions 170 and 180 to the critical dimension and overlay of the resist protection oxide layer 160 and the resist protection oxide etch. Instead, the dimensions of the resistor silicide regions 170 and 180 are determined by the critical dimension and overlay of the gates 120 and 140 and aligned with the highly doped regions 116. As such, the variation of the silicide regions is dependent on formation of the gates 120 and 140, with techniques that utilize, for example, an immersion tool, and highly doped regions 116.

In the transistor 300, silicide formation is inhibited by the resist protection oxide layer 370 and the gates 320 and 340. The overlapping of the resist protection layer 370 with the gates 320 and 340 eliminates dimensional variation of the transistor silicide regions 380 and 390 to the critical dimension and overlay of the resist protection oxide layer 370 and the resist protection oxide etch. Instead, the dimensions of the transistor silicide regions 380 and 390 are determined by the critical dimension and overlay of the gates 320 and 340 and aligned with the highly doped regions 316. As such, the variation of the transistor silicide regions 380 and 390 is dependent on the formation of the gates 320 and 340, with techniques utilizing, for example, an immersion tool, and the highly doped regions 316. The lightly doped regions 318 at the input-output are applied in combination with the minimized gate length 364, as depicted in FIG. 1, to minimize open issues. This is accomplished by the absence of dopant in the vicinity below the second gate 340 and minimizing the length 364 to short lightly doped regions 318 together, preventing current from flowing in this area. As a result, high resistivity can be achieved due to these lightly doped regions 318 and aid electrostatic discharge in the dummy polysilicon layer 126, as depicted in FIG. 1.

Referring to FIGS. 1 and 4, an interlayer dielectric material is deposited forming a layer 400 overlying the semiconductor substrate 110 and the shallow trench isolation structures 20 of the resistor 100 and transistor 300. For purposes of the instant application, the "interlayer dielectric layer" refers to a layer or layers of dielectric material that are formed during back-end-of-line (BEOL) fabrication and that at least partially remain in the integrated circuit after fabrication. The interlayer dielectric layer 400 includes material that exhibits different etch selectivity in at least one type of etchant as compared to the dummy layer 126 to enable selective etching of the dummy layer 126 without materially etching the interlayer dielectric layer 400. In these embodiments, the interlayer dielectric layer 400 can be a low-k or ultra-low k material such as an oxide. As referred to herein, "low-k" material also encompasses ultra low-k, extremely low-k, or any other low-k material as understood in the art, materials which are particularly useful in dielectric layers of integrated circuits. One specific example of a suitable oxide is silicon oxide formed through high density plasma deposition. Alternatively, the interlayer dielectric material may be a silicon nitride or a silicon carbide. Such low-k or ultra low-k dielectric materials are known in the art and are particularly useful in dielectric layers of integrated circuits. After depositing the interlayer dielectric layer 400, any suitable process may be utilized such as chemical-mechanical polishing to remove excess dielectric material.

Referring to FIG. 5, a hard mask may be formed into a layer 404 overlying the interlayer dielectric layer 400 and overlying the gates 120, 140, 320, and 340. The hard mask or mask 404 includes at least one of titanium nitride, titanium carbide, or silicon nitride, and particularly titanium nitride. A photoresist film or mask may be deposited and formed into a layer 410 overlying the hard mask layer 404.

Figure 6:
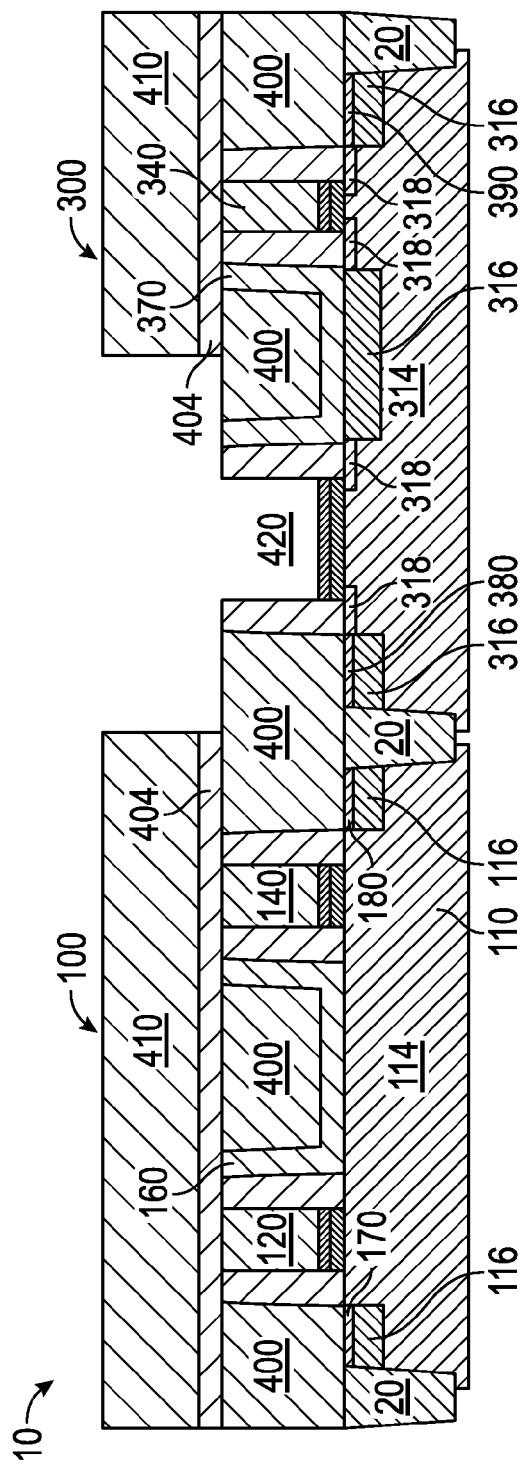

Referring to FIGS. 1 and 6, subsequently, the photoresist film layer 410 is patterned to remove portions of the photoresist film and hard mask overlying the first gate 320 of the transistor 300. Thus, a void or electrode recess 420 is revealed. The dummy layer 126 may be removed through etching using a conventional etchant that is selective to polysilicon over the material of the interlayer dielectric layer 400, such as silicon oxide formed through high density plasma deposition. An example of a suitable etchant for the polysilicon in the dummy layer 126 is chlorine-based plasma.

Figure 7:
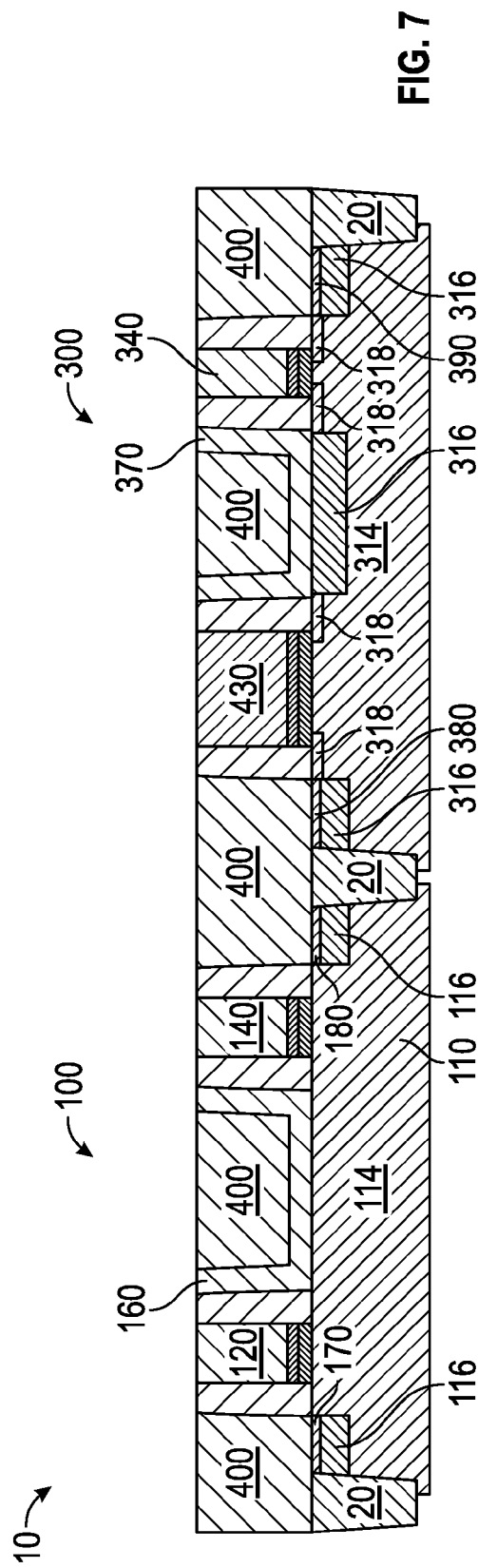

Referring to FIGS. 6-7, an electrically conductive material, such as an N-type metal, is deposited in void 420 as a fill 430 in accordance with conventional electrode formation through gate-last replacement metal gate techniques and the remainder of the mask layers 404 and 410 can be removed using any suitable process, such as chemical-mechanical polishing. In other embodiments, it is contemplated that a P-type metal may be used as the electrically conductive material. Subsequent processes can be performed to finalize IC fabrication.

Figure 8:
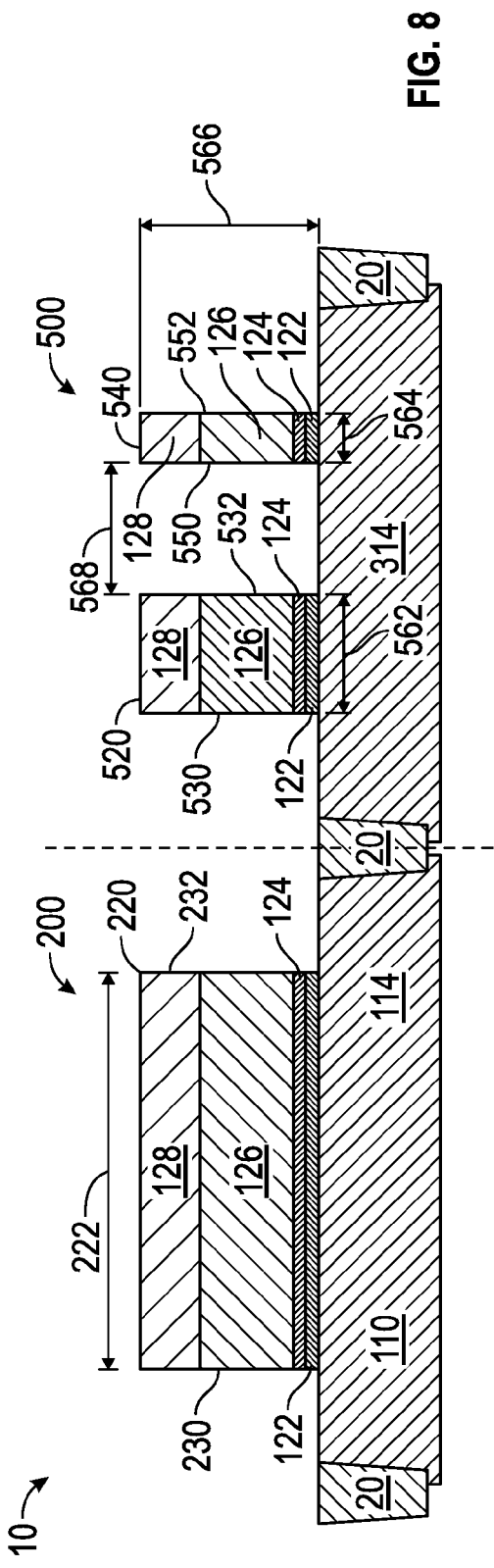

Referring to FIG. 8, another version of an integrated circuit (IC) or partly fabricated semiconductor device 10 is provided having a resistor 200 and a transistor 500 as separate components as indicated by the dashed line. Components having similar structure and/or functionality may use the same reference numerals. The resistor 200 and the transistor 500 share a semiconductor substrate 110. Shallow trench isolation (STI) structures 20 are disposed therein, including an STI structure 20 between the resistor 200 and the transistor 500. In the illustration of FIG. 8, three STI structures 20 are formed, although it is to be appreciated that numerous STI structures 20 may be formed in the integrated circuit 10 and various networks of STI structures 20 may be formed in accordance with conventional integrated circuit design.

In accordance with this embodiment, the resistor 200 has the semiconductor substrate 110, which may include a first or N-type well region 114 that is formed through conventional fabrication techniques, as described above, and the transistor 500 has another portion of the semiconductor substrate 110, which may include a second or P-type well region 314 that is formed through conventional fabrication techniques, as described above.

The resistor 200 has a gate or resistor structure 220 and the transistor 500 has a first gate (or second gate on IC 10) 520 and a second (or third gate on IC 10) gate 540 with the gates 220, 520, and 540 including layers 122, 124, 126, and 128, as described above. The gate 220 can be centered about the semiconductor substrate 110 on the resistor 200 portion of the semiconductor substrate 110 and have a longer length, as compared to the gate 120 described above, to inhibit silicide formation to an area outside the gate 220, as discussed in further detail hereinafter. Generally, the gate 220 has a length 222 greater than about 10 microns, absent spacers and the resistor 200 excludes lightly doped regions. In one exemplary embodiment, the resistor requires a N-type well region 114 as opposed to a P-type well region.

In the transistor 500, a spacing or distance 568 between the first gate 520 and the second gate 540 absent spacers 536 and 554 is no more than about 80 nm, hereinafter described. The spacers 536 and 554 can further reduce the spacing 568 of the gates 320 and 340. The second gate 540 has a length 564 less than a length 562 of the first gate 520 and the length 564 absent spacers 554 and 556 is no more than about 30 nm, or no more than about 20 nm, as hereinafter described. The first and second gates 520 and 540 have a high aspect ratio of gate height 566 to spacing 568 of from about 1.5:1 to about 2.5:1. In this embodiment, each gate 520 and 540 is a dummy gate electrode structure, as described above, patterned overlying semiconductor material of the semiconductor substrate 110 including a P-type well region 314.

Figure 9:
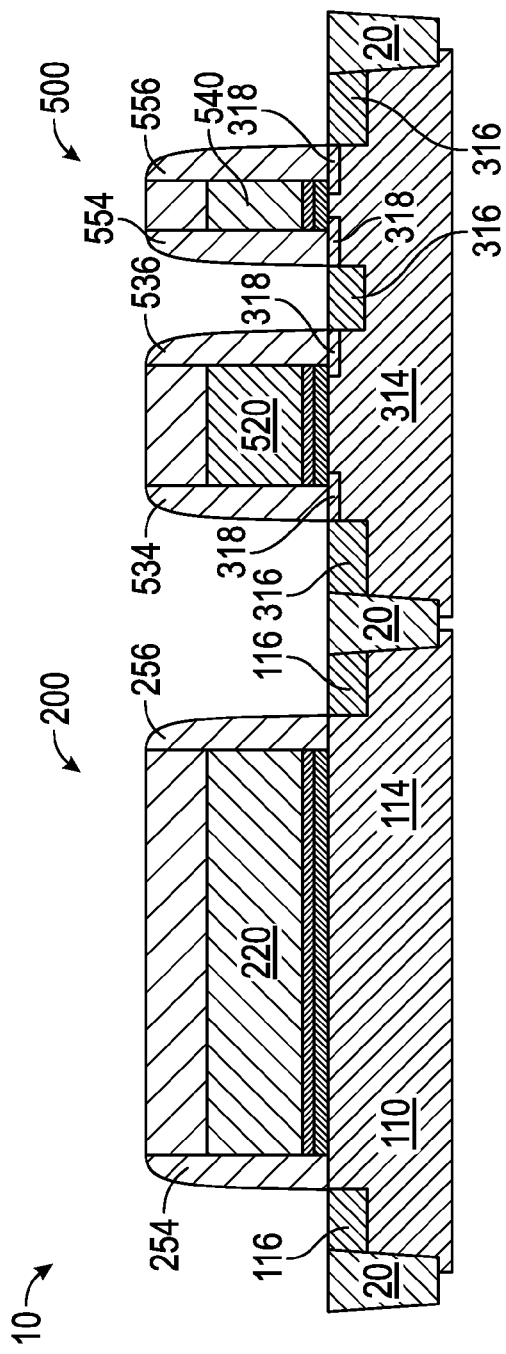

Referring to FIG. 9, spacers 254 and 256 are formed at respective sidewalls 230 and 232 around the gate 220, spacers 534 and 536 are formed at respective sidewalls 530 and 532 around the gate 520, and spacers 554 and 556 are formed at respective sidewalls 550 and 552 around the gate 540. The spacers 254, 256, 534, 536, 554, and 556 define source and drain regions and protect, respectively, the gates 220, 520, and 540 during subsequent high concentration dopant implantation forming highly doped regions 116 of the resistor 200 and highly doped regions 316 of the transistor 500. The gate 220 and spacers 254 and 256 result in the highly doped regions 116 being formed outside the spacers 254 and 256 in the resistor 200. In addition, lightly doped source and drain regions 318 are formed proximate to and underneath the spacers 534 and 536 of the gate 520 and spacers 554 and 556 of the gate 540 of the transistor 500, as described above.

Figure 10:
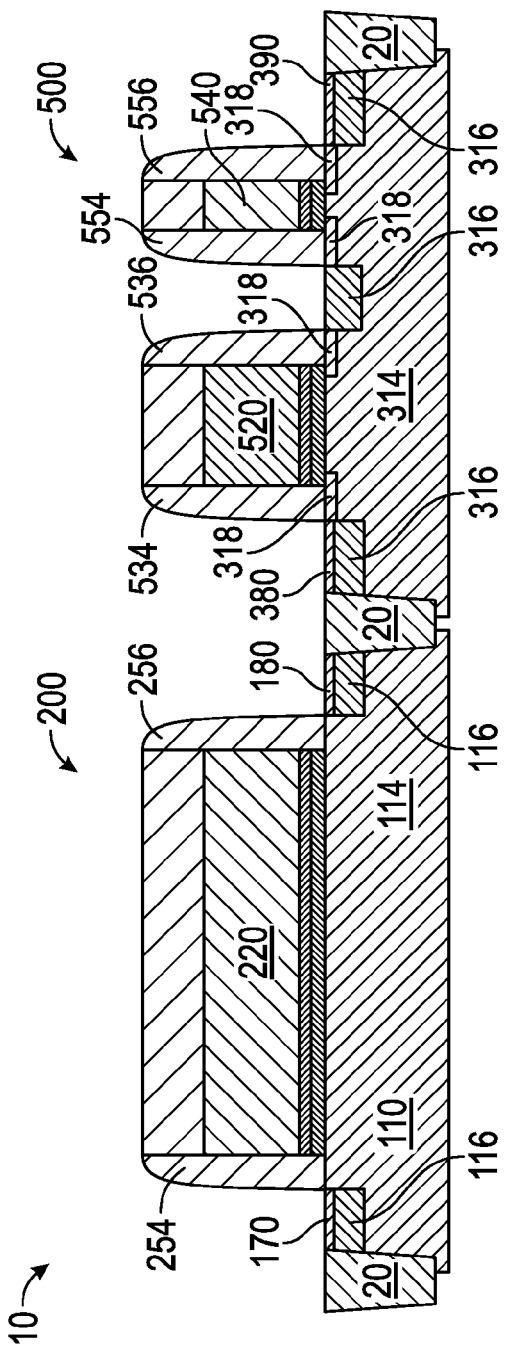

Referring to FIGS. 8 and 10, the gate 220 and the spacers 254 and 256 inhibit silicide formation to outside the spacers 254 and 256. Instead, the first resistor silicide region 170 and the second resistor silicide region 180 are formed in highly doped regions 116 in the resistor 200. In the transistor 500, the second gate 540 is formed proximate to the first gate 520 forming a high aspect ratio therebetween, as described above. Hence, the metal, such as nickel, cannot fill the gap between the spacers 536 and 554. The gates 520 and 540 are formed as close as possible so the gate height exceeds as much as possible the distance 568 between the gates 520 and 540, specifically the spacers 536 and 554. As a result, the formation of the first transistor silicide region 380 and the second transistor silicide region 390 are outside the gates 520 and 540, and more particularly outside the spacers 534 and 556. The silicidation process can be performed as described above.

Referring to FIG. 11, an interlayer dielectric layer 400 is formed overlying the semiconductor substrate 110 and the shallow trench isolation structures 20 of the resistor 200 and transistor 500, as described above. After forming the interlayer dielectric layer 400, any suitable process may be utilized such as chemical-mechanical polishing to remove excess dielectric material.

Figure 13:
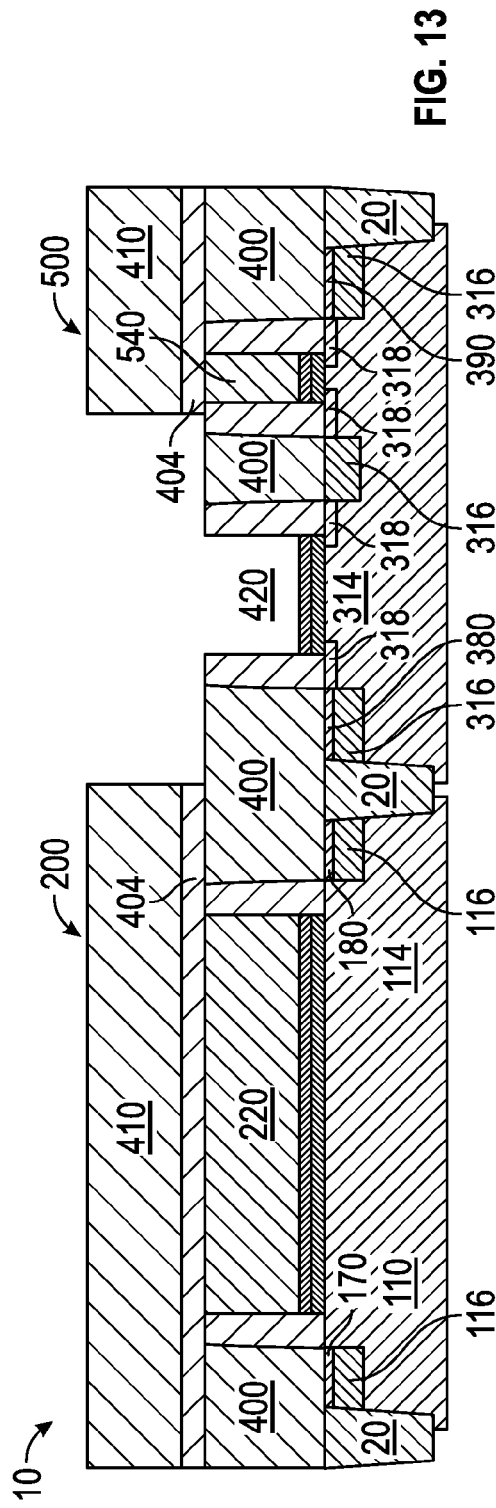

Referring to FIGS. 8 and 12-13, a hard mask layer 404 may be formed overlying the interlayer dielectric layer 400 and overlying the gates 220, 520, and 540, similarly as described above. A photoresist film or mask may be deposited to form a layer 410 overlying the hard mask layer or hard mask 404, and is patterned to remove portions of the photoresist film and hard mask, as described above, overlying the first gate 520 of the transistor 500. Thus, a void or electrode recess 420 is revealed. The dummy layer 126 may be removed through etching using a conventional etchant that is selective to polysilicon over material of the interlayer dielectric layer 400, such as silicon oxide formed through high density plasma deposition. An example of a suitable etchant for the polysilicon in the dummy layer is chlorine-based plasma.

Figure 14:
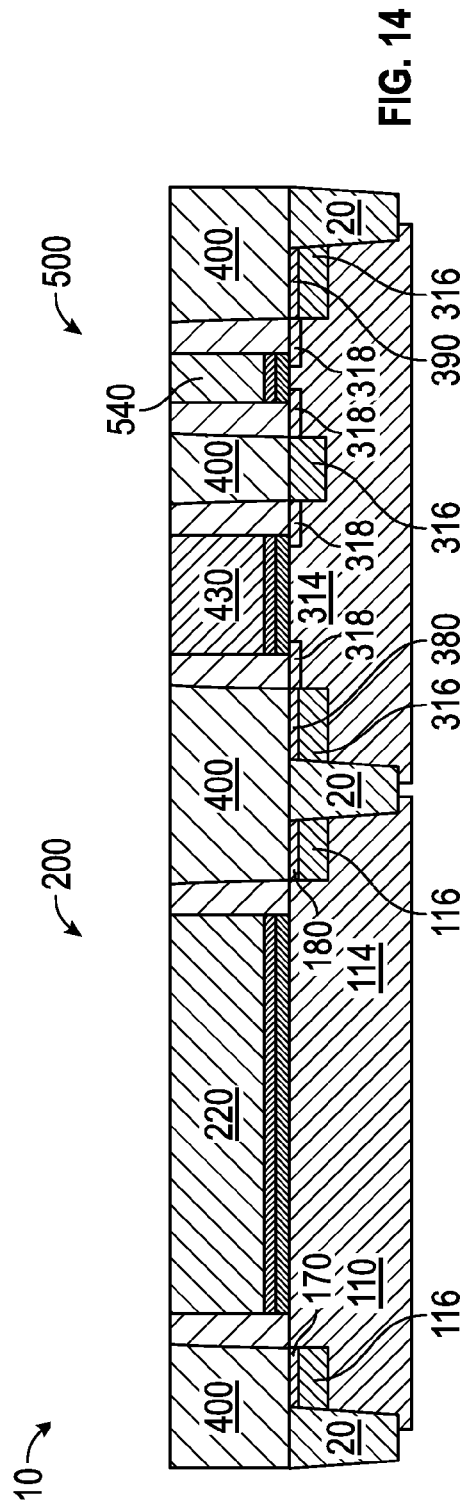

Referring to FIGS. 13 and 14, an electrically conductive material, such as N-type metal, is deposited in void 420 as a fill 430 in accordance with conventional electrode formation through gate-last replacement metal gate techniques and the remainder of the mask layers 404 and 410 can be removed using any suitable process, as described above. In other embodiments, it is contemplated that a P-type metal may be used as the electrically conductive material. Subsequent processes can be performed to finalize IC fabrication.

The embodiments disclosed herein can reduce variation in the resistor and/or transistor components of an integrated circuit. As a result, less variation allows more compact designs and/or better area usage. As an example, higher resistivity can be provided to a transistor, resulting in less area usage. What is more, layers can be eliminated during fabrication, such as a resist protection layer.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating a semiconductor device, wherein the method comprises:
   providing a partially fabricated semiconductor device, comprising:
      a semiconductor substrate;
      a first gate formed over the semiconductor substrate; and
      a second gate formed over the semiconductor substrate and spaced apart from the first gate;
   forming spacers on sidewalls of the first gate and sidewalls of the second gate;
   forming a mask between the first gate and the second gate;
   implanting a dopant into the semiconductor substrate to form highly doped source-drain regions outside of the first gate and the second gate and lightly doped source-drain regions underneath the spacers;
   removing the mask between the first gate and the second gate;
   depositing a protection layer between the first gate and the second gate; and
   forming silicide regions outside of the first gate and the second gate;
   wherein silicide formation between the first gate and the second gate is inhibited by the protection layer.

2. The method of claim 1, wherein depositing a protection layer between the first gate and the second gate comprises depositing a resist protection oxide between the first and second gates before forming silicide regions.

3. The method of claim 1, wherein forming spacers comprises forming the spacers with the spacing between the first gate and the second gate having an aspect ratio of gate height to spacing of from about 1.5:1 to about 2.5:1.

4. The method of claim 1, wherein the second gate absent spacers has a length of no more than about 30 nanometers.

5. The method of claim 1, wherein a spacing between the first gate and the second gate absent spacers is no more than about 80 nanometers.

6. The method of claim 1, further comprising after forming the silicide regions:
   depositing an interlayer dielectric material over the semiconductor substrate to form an interlayer dielectric layer;
   forming a hard mask over the first gate, the second gate, and the interlayer dielectric layer;
   patterning the hard mask to expose the first gate;
   removing at least a portion of the first gate to create a void; and
   filling the void with an electrically conductive material.

7. A method of fabricating an integrated circuit, comprising:
   providing a partially fabricated semiconductor device comprising:
      a semiconductor substrate with a first well region adjacent to a second well region;
      a first gate and a second gate over the first well region; and
      spacers on the first gate and the second gate; and
   forming silicide regions outside of and self-aligned with the spacers on the first and second gates; wherein silicide formation between the first gate and the second gate is inhibited.

8. The method of claim 7, wherein the first gate and the second gate are on the first well region.

9. The method of claim 7, further comprising forming a third gate and a fourth gate over the second well region, forming a first resist protection layer between the first and second gates, and forming a second resist protection layer between the third and fourth gates wherein the resist protection layers inhibit silicide formation.

10. The method of claim 7, wherein the first well region comprises a P-type well region for manufacturing a transistor and the second well region comprises an N-type well region for manufacturing a resistor.

11. The method of claim 10, further comprising forming spacers around the first and second gates creating a high aspect ratio therebetween before forming silicide regions to inhibit silicide formation.

12. The method of claim 7, wherein providing the partially fabricated semiconductor device comprises providing an exposed portion of the first well region between the first gate and the second gate.

13. The method of claim 12, further comprising depositing a protection layer over the first gate, the second gate and on the exposed portion of the first well region between the first gate and the second gate, wherein the protection layer inhibits silicide formation between the first gate and the second gate.

14. A method of fabricating an integrated circuit, comprising:
   providing a partially fabricated semiconductor device comprising:
      a semiconductor substrate with a first well region adjacent to a second well region;
      a first gate and a second gate over the first well region; and
      a third gate and a fourth gate over the second well region;
   forming a first protection layer between the first and second gates;
   forming a second protection layer between the third and fourth gates; and
   forming silicide regions outside of the first and second gates; wherein the protection layers inhibit silicide formation between the first gate and the second gate and between the third gate and the fourth gate.

15. The method of claim 14 wherein providing the partially fabricated semiconductor device comprises providing the partially fabricated semiconductor device comprising spacers on the first gate and the second gate, and wherein forming the silicide regions outside of the first and second gates comprises forming the silicide regions self-aligned with the spacers on the first and second gates.

16. The method of claim 14, wherein the first gate and the second gate are on the first well region and the third gate and fourth gate are on the second well.

17. The method of claim 14, wherein providing the partially fabricated semiconductor device comprises providing an exposed portion of the first well region between the first gate and the second gate and an exposed portion of the second well region between the third gate and the fourth gate.

18. The method of claim 14, wherein providing the partially fabricated semiconductor device comprises providing an exposed portion of the first well region between the first gate and the second gate and an exposed portion of the second well region between the third gate and the fourth gate, wherein forming the first protection layer between the first and second gates comprises forming the first protection layer on the exposed portion of the first well region between the first gate and the second gate, and wherein forming the second protection layer between the third and fourth gates comprises forming the second protection layer on the exposed portion of the second well region between the third gate and the fourth gate.

19. The method of claim 14, wherein forming the first protection layer between the first and second gates and forming the second protection layer between the third and fourth gates comprises depositing a resist protection oxide and patterning the resist protection oxide.

20. The method of claim 1, wherein forming the silicide regions outside of the first gate and the second gate comprises forming the silicide regions self-aligned with the spacers.

* * * * *